United States Patent [19]
Seshita et al.

[11] Patent Number: 5,225,718
[45] Date of Patent: Jul. 6, 1993

[54] STANDARD-CELL TYPE SEMICONDUCTOR LOGIC LSI WITH LOGICAL AMPLITUDE ENHANCER

[75] Inventors: Toshiki Seshita, Kawasaki; Atsushi Kameyama, Kanagawa; Katsue Kawakyu, Kawasaki; Tadahiro Sasaki, Tokyo, all of Japan

[73] Assignee: Kabushiki Kaisha Toshiba, Kawasaki, Japan

[21] Appl. No.: 529,441

[22] Filed: May 29, 1990

[30] Foreign Application Priority Data

May 29, 1989 [JP] Japan .................................. 1-135504
Sep. 13, 1989 [JP] Japan .................................. 1-235780

[51] Int. Cl.⁵ ................ H03K 19/173; H03K 19/0175
[52] U.S. Cl. .................................... 307/465; 307/475; 307/448
[58] Field of Search ............... 307/246, 465, 468, 475, 307/448, 450

[56] References Cited

U.S. PATENT DOCUMENTS

| | | | |
|---|---|---|---|
| 4,527,079 | 7/1985 | Thompson | 307/475 |
| 4,798,978 | 1/1989 | Lee et al. | 307/448 |
| 4,831,284 | 5/1989 | Anderson et al. | 307/475 |
| 4,931,670 | 6/1990 | Ting | 307/448 |
| 4,945,258 | 7/1990 | Picard et al. | 307/475 |
| 4,965,863 | 10/1990 | Cray | 307/448 |

FOREIGN PATENT DOCUMENTS 6432647 7/1987 Japan .

Primary Examiner—Edward P. Westin
Assistant Examiner—Andrew Sanders
Attorney, Agent, or Firm—Oblon, Spivak, McClelland, Maier & Neustadt

[57] ABSTRACT

A standard cell type gallium arsenide logic integrated circuit device includes arrays of standard cells connected to each other on a chip substrate. Each of the standard cells includes a plurality of gallium arsenide logic gates of previously selected type such as NOR gates and an inverter. The logic gate has a direct-coupled type FET logic circuit structure. In each of the standard cells, level-shift circuits are provided only for inputs of those logic gates which are directly connected to connection terminals directly associated with the other standard cell. The level-shift circuits enhance the swing width of a logic signal transmitted between the standard cells which are associated with one another, thereby increasing the operation margin. Such a level-shift circuit is not provided for internal interconnection wirings between the logic gates inside the standard cell.

24 Claims, 8 Drawing Sheets

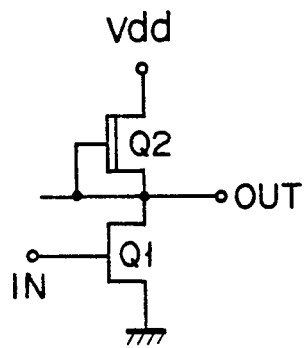
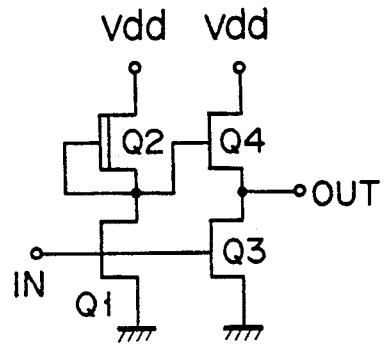
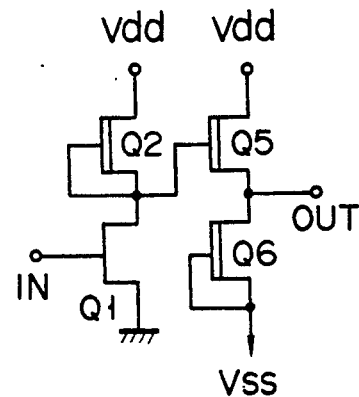
FIG. 3A  FIG. 3B  FIG. 3C
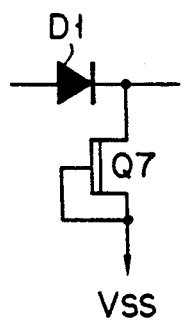
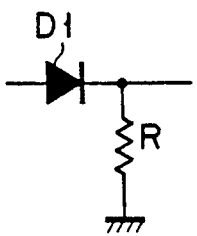
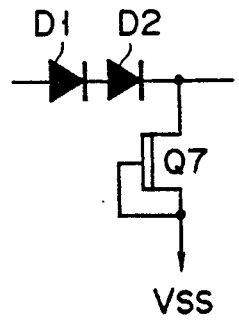
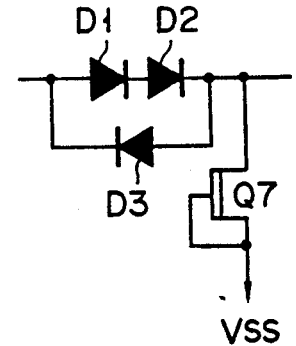
FIG. 4A  FIG. 4B  FIG. 4C  FIG. 4D

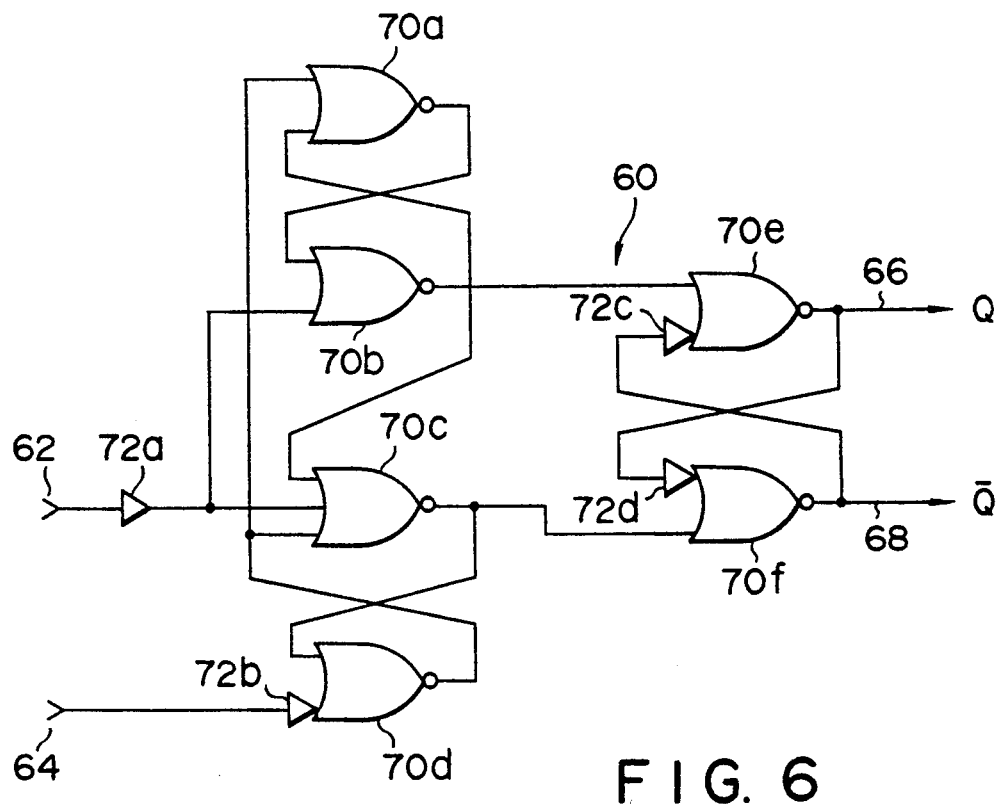
F I G. 6
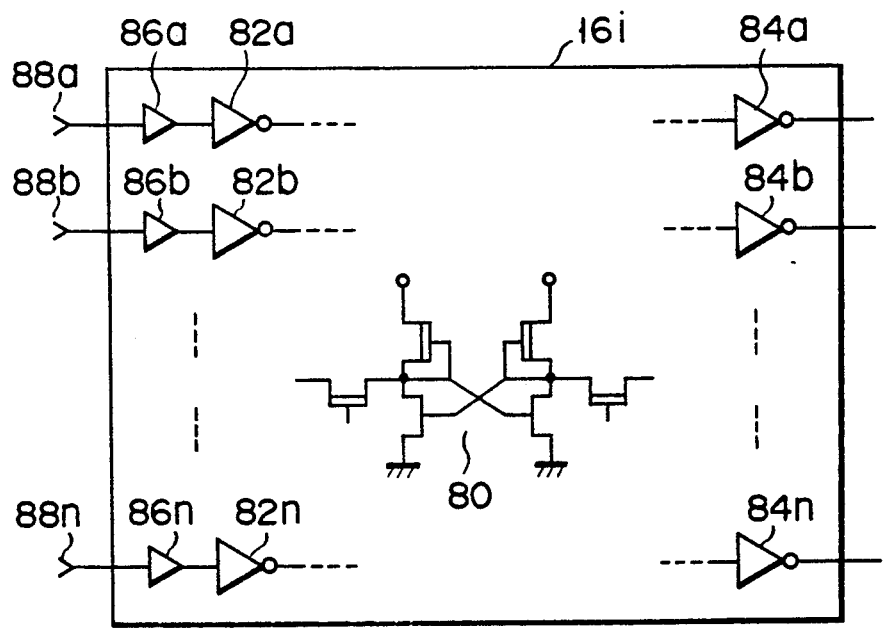
F I G. 7

STANDARD-CELL TYPE SEMICONDUCTOR LOGIC LSI WITH LOGICAL AMPLITUDE ENHANCER

BACKGROUND OF THE INVENTION

1. Fied of the Invention

This invention relates to semi-custom semiconductor logic integrated circuit devices, and more particularly to standard-cell type gallium arsenide large scale integrated circuit devices.

2. Description of the Related Art

With an increase in the performance and reliability of large scale digital systems, the technique for forming highly integrated electronic parts such as ICs and LSIs becomes indispensable. In particular, with the recent development of computer technology, semiconductor logic LSIs have made remarkable progress in both the integration density and performance thereof. Also, semi-custom semiconductor logic integrated circuit devices are not an exception. In general, it is safe to say that standard-cell type logic devices are dominant among semi-custom logic LSIs for semiconductor device manufacturers.

The standard-cell type logic device has standard circuits of previously selected types formed on a substrate. The standard circuits are previously selected from those registered in a library in order to attain a desired LSI logic function. An internal circuit design of the logic devices is typically made by using an automatic designing tool such as a computer-aided design (CAD). The automatic design of the internal circuit is effected by wiring a large number of standard circuits according to an adequate routing algorithm. When the internal wiring design is completed, a logic device of a desired function can be obtained.

However, presently available standard-cell type logic devices have a problem that there is a limitation of possibility for increasing both the integration density and the operation reliability thereof at the same time as will be described in detail hereinafter. In general, with this type of semi-custom logic device, the standard circuits are constructed by direct-coupled FET logic circuits having gallium arsenide (GaAs) logic gates. The direct-coupled FET logic gate circuits (which are hereinafter referred to as "DCFL circuits" according to the practice in this technical field) have no level-shift stages. Therefore, since the number of circuit constituting elements for each unit gate is small, a larger number of DCFL circuits can be laid out on the chip substrate of a limited size. This is advantageous in increasing the integration density of the standard-cell type logic device.

In contrast, the logic swing width of DCFL circuits may be set as low as approx. 0.6 volts without the level-shift stage. The small logic amplitude is advantageous from the viewpoint of increase in the operation speed. However, it causes a great obstacle to the enhancement of the operation reliability of the standard-cell type logic device. This is because the small logic swing width reduces the noise margin of the DCFL circuit and increases the rate of occurrence of logic operation error.

The DCFL standard circuits of the standard-cell type logic device include some standard cells. Each of the standard cells is connected with power supply lines. The power supply lines are a ground line and a power source voltage supply line. Where the power supply lines are formed to connect the DCFL standard circuits which are separately formed on the chip substrate on the entire portion of the substrate, then the total length of the power supply lines may be substantially the same as that of other ordinary signal transmission wirings. Since MESFETs are generally used for standard cells in GaAs-LSIs, small dissipation currents flow in all of the standard cells, so that the actual ground potential of the ground line is raised from an ideal 0 volt and becomes unstable. The "instability" phenomenon of the ground potential becomes significant in an area which is far apart from external connection pads of the chip substrate or the central area of the chip wirings, and as a result, the effective logic swing width of the DCFL standard circuits is lowered accordingly. If the logic amplitude is originally set as low as 0.6 volts, the effective amplitude is further lowered. This not only reduces the noise margin but also extremely degrades the stability of the logic operation. As a result, the operation reliability of the standard-cell type logic device is lowered.

Occurrence of the "instability" phenomenon of the ground potential may be suppressed to some extent by making the power supply lines thicker to lower the wiring resistance; however, in this case, the area of the power supply lines increases, deteriorating the feature of high integration density which can be attained as the inherent merit of the DCFL standard circuit.

SUMMARY OF THE INVENTION

It is therefore an object of the present invention to provide a new and improved semi-custom semiconductor logic integrated circuit device which is excellent in both the integration density and operation reliability.

In accordance with the above object, the present invention is addressed to a specific semi-custom semiconductor logic integrated circuit device mounting structure. The device comprises a semiconductive substrate; and unit circuits formed on the substrate. Each of the unit circuits includes direct-coupled transistor logic circuits having connection nodes directly associated with the remaining unit circuits and for dealing with logic signals having a first preset logic swing width. The unit circuits are connected to one another to attain a desired logic function Level-shift circuit sections are provided at a selected one of the connection nodes of the unit circuit or a plurality of specified connection nodes thereof and define a second logic swing width larger than the first logic swing width whereby a logic signal transmitted between the unit circuits can be increased more in its logic amplitude than a logic signal transmitted inside the unit circuit.

The present invention and its objects and advantages will become more apparent in the detailed description of a preferred embodiment presented below.

BRIEF DESCRIPTION OF THE DRAWINGS

In the detailed description of a preferred embodiment of the present invention presented below, reference is made to the accompanying drawings in which:

FIGS. 3A to 3C are diagrams showing some concrete constructions of direct-coupled FET logic circuits used for forming logic gates included in the standard-cell circuit of FIG. 2;

FIGS. 4A to 4G are diagrams showing some concrete constructions of circuits used for forming level-shift circuits loaded on the standard cells of FIG. 2;

FIG. 6 is a circuit diagram of another embodiment of this invention;

FIG. 7 is a circuit diagram of still another embodiment of this invention;

DETAILED DESCRIPTION OF THE PREFERRED EMBODIMENTS

Figure 1:
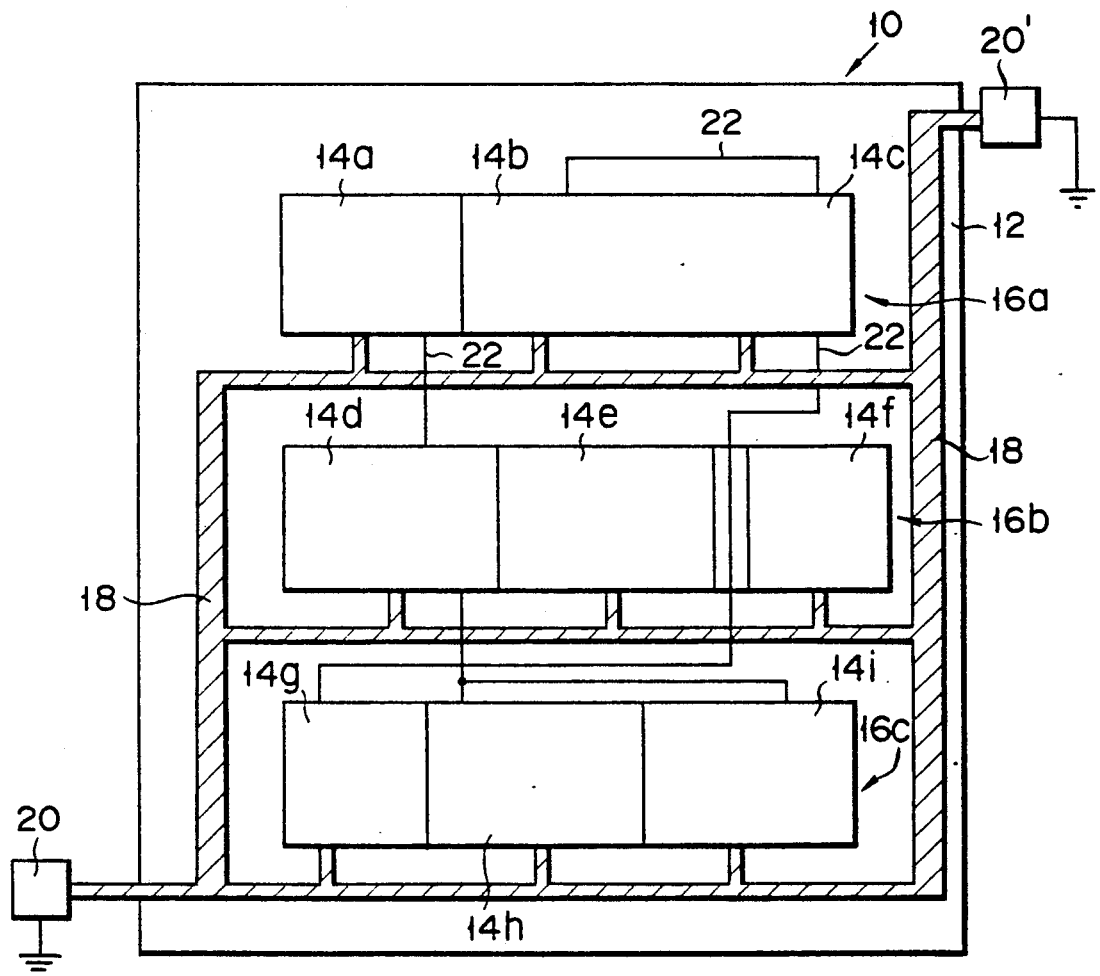
FIG. 1 is a diagram schematically showing the entire plan view of a standard-cell type semi-custom logic integrated circuit device according to a preferred embodiment of this invention.

In FIG. 1, a standard-cell type semi-custom gallium arsenide (GaAs) logic integrated circuit device according to a preferred embodiment of this invention is generally designated by a reference numeral "10". The device of FIG. 1 is shown in a greatly simplified form for brief and effective explanation of the drawing and a significantly reduced number of standard circuits are shown here; in the actual application, a larger number of standard circuits are wired in a more complicated fashion.

The standard-cell type logic LSI 10 has a chip substrate 12. Standard-cell circuits 14a, 14b, 14c, . . . are arranged on the substrate 12. As shown in FIG. 1, the standard cells 14 are grouped into a selected number of circuit blocks 16a, 16b and 16c. The circuit blocks 16 may be called "standard-cell rows", but in this specification, they are referred to as "function blocks". Each of the standard cells 14 includes one or more gallium arsenide logic gates (standard gates). Each of the standard cells 14 is connected with power source lines including a power source voltage supplying line and a ground line. For example, as shown in FIG. 1, the ground line is a thick conductive wiring 18 which is common for all of the standard cells 14. The ground wiring 18 is connected with an external ground terminal 20 of the chip. The power source voltage supply line is not shown in FIG. 1, but it is formed to have the same construction. Signal transmission lines 22 are provided between the standard cells 14 to make an adequate signal input/output wiring pattern. (In the illustrated standard cell arrangement, cell 14e that is in the central position of LSI 10 tends to increase in its ground potential.)

Figure 2:
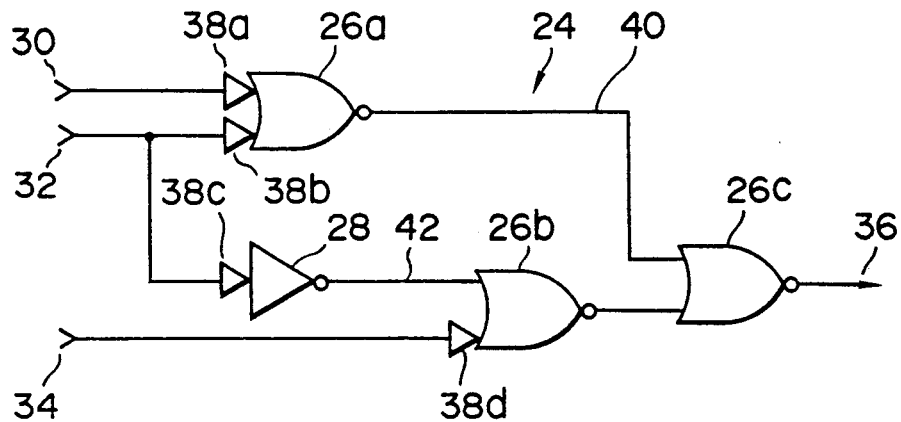
FIG. 2 is a diagram showing a data selection circuit formed on one of standard cells of the device of FIG. 1.

For example, where the standard cell 14a includes a data selection circuit 24, it is important that the data selection circuit has a construction made by partly connecting level-shift circuits to the direct-coupled FET logic circuit structure. This is explained more in detail. As shown in FIG. 2, basically, the data selection circuit 24 is a direct-coupled FET logic circuit (which may be hereinafter referred to as a "DCFL" circuit) which includes three NOR gates 26a, 26b and 26c and one inverter 28. The first NOR gate 26a has two inputs which are respectively connected with external connection terminals 30 and 32. The external connection terminal 32 is connected with a first input of the second NOR gate 26b via the inverter 28. A second input of the second NOR gate 26b is connected with another external connection terminal 34. Outputs of the first and second NOR gates 26a and 26b are connected with first and second inputs of the third NOR gate 26c. The third NOR gate 26c creates a selected data signal on the output stage thereof. The output data appears on an external connection terminal 36.

It should be noted that level-shift circuits 38 are additionally provided for or connected to those specified inputs among the inputs and outputs of the logic gates 26 and 28 which are directly associated with the external connection terminals 30, 32, 34 and 36. That is, as is clearly shown in FIG. 2, level-shift circuits 38a and 38b are provided for the first and second inputs of the first NOR gate 26a which are directly connected to external connection terminals 30 and 32. Likewise, a level-shift circuit 38c is provided for an input of the inverter 28 which is directly associated with the external connection terminal 32 and a level-shift circuit 38d is provided only for one input of the NOR gate 26b which is directly associated with the external connection terminal 32. No level-shift circuit is provided for the other input of the second NOR gate 26b which is connected to the output of the inverter 28. This is because this input is not directly connected to the external connection terminal. One of the features of this circuit construction is that no level-shift circuit is provided for the gate terminal which is interconnected with the internally constructed logic gate of the data selection standard cell circuit 24. For the same reason, no level-shift circuits are provided for both the inputs of the NOR gate 26c. The logic circuit structure of "direct-coupled type with partially provided level-shift stages" is hereinafter referred to as a "partial level-shift type" logic circuit.

Figure 4E:
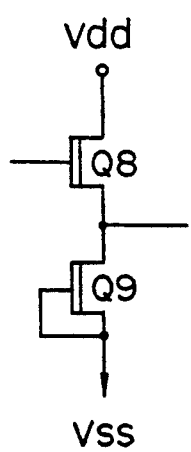
Figure 4F:
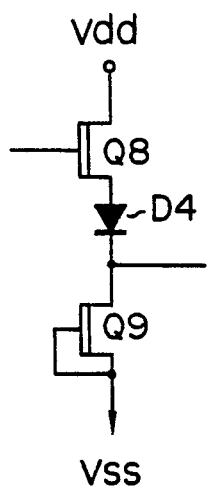
Figure 4G:
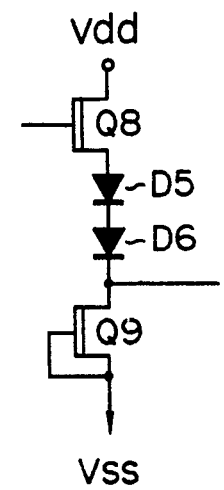

The logic gates 26a, 26b, 26c and 28 can be realized by using one of the direct-coupled FET circuits shown in FIGS. 3A to 3C or combining selected ones of the direct-coupled FET circuits. The circuit of FIG. 3A has a series circuit of two FETs Q1 and Q2 as a standard structure The circuit of FIG. 3B is constructed by four FETs Q1, Q2, Q3 and Q4. The circuit of FIG. 3C has a circuit construction which additionally has a series circuit of two FETs Q5 and Q6 connected in parallel with the series circuit of the FETs Q1 and Q2 of FIG. 3A. The level-shift circuits 38a, 38b, 38c and 38d can be realized by using one of the circuits shown in FIGS. 4A to 4G or combining selected ones of the direct-coupled FET circuits. Each of the level-shift circuits shown in FIGS. 4A to 4D is basically constructed by one or more Schottky diodes D1 and D2 and a pull-down FET Q7 provided on the cathode side thereof. Level-shift circuits shown in FIGS. 4E to 4G are source-follower FET circuits.

According to the above "partial level-shift type" logic circuit structure, the external logic amplitude is permitted to be made larger than the internal logic swing width in each of the standard cells 14 of the semicustom LSI 10. This is because the level-shift circuits 38 are connected only to those of the inputs and outputs of the their own logic gates which are directly associated with the external standard cells so that the effective logic level "H" on the external wirings connected between the standard cells 14 can be raised by the level-shift voltage from the initial voltage of 0.6 volts. For example, where the level-shift voltage of the level-shift circuits 38 is 0.7 volts (the level shift voltage can be easily attained by means of the circuits shown in FIGS. 4A through 4G), the "H" level voltage on the external wirings may be set to 1.3 volts. Since the logical threshold voltage is raised accordingly, the operation margin can be greatly improved. As a result, not only the noise margin but also the margin for the conventional "instability" phenomenon of the ground potential can be increased. Thus, the operation reliability of the direct-coupled standard cell circuit structure can be significantly improved.

With the above "partial level-shift type" logic circuit structure, the integrated density of the standard-cell type semi-custom LSI ca also be maintained at a high degree. This is because level-shift circuits which serve to permit addition of extra circuit structures are not connected to the signal transmission lines between the logic gates 26 and 28 in each of the standard cells 14. For example, in FIG. 2, no level-shift circuits are provided for the internal wirings 40 and 42. The logic swing width on the internal signal transmission lines in each of the standard cells 14 is kept at 0.6 volts without the level-shift circuit. However, this will not lower the operation reliability of the standard cell. This is because the signal transmission lines between the logic gates in the standard cells which are arranged close to one another are short so that the "instability" phenomenon of the ground potential can be made as small as negligible, the ground potential can be kept substantially constant, and interference by noise from the exterior can be neglected. In each of the standard cells, since the direct-coupled logic circuit structure is complete, its inherent feature of high operation speed can be sufficiently maintained. For example, the set-up time and/or access time can be saved to improve the processing speed of the entire portion of the function block. With the above features, the semi-custom LSI of this embodiment may exhibit excellent performances in all of the operation reliability, integrated density and high operation speed.

Figure 5:
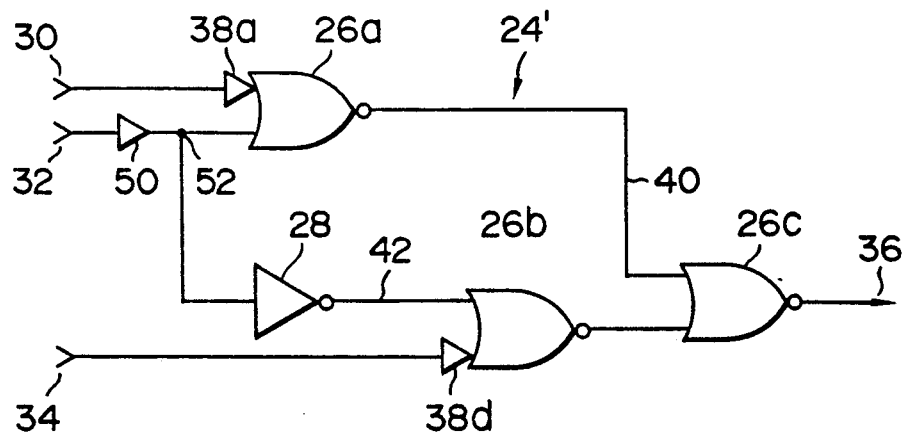
FIG. 5 is a diagram showing one possible modification of a data selection circuit of FIG. 2.

The internal circuit structure of the standard cell of FIG. 2 may be modified as shown in FIG. 5: the modified structure is generally designated by reference numeral "24'." In this case, the level-shift circuits 38b and 38c of FIG. 2 are replaced by a common level-shift circuit 50. In other words, as shown in FIG. 2, since the input of the level-shift circuit 38b provided in one of the inputs of the NOR gate 26a and the input of the level-shift circuit 38c provided in the input of the inverter 28 are commonly connected to a node 52, the same level shift function can be attained with a simple construction by providing one level-shift circuit 50 at the preceding stage of the node 52. When the level-shift circuit 50 is constructed by using a diode type level-shift circuit shown in one of FIGS. 4B to 4D, Schottky diodes having large capacitances may be preferably used as the level-shifting diodes if the time delay due to the level shifting operation exceeds the permitted limit.

A D-type flip-flop circuit (DFF) 60 utilizing the concept of the "partial level-shift type" logic circuit structure of this invention is shown in FIG. 6 as a second embodiment of this invention. The DFF circuit 60 includes two inputs (external connection terminals) 62 and 64 and two outputs 66 and 68 (Q and $\bar{Q}$). Six NOR gates 70a to 70f are provided between the above terminals and connected to one another as shown in FIG. 6 to present a direct-coupled FET logic (DCFL) circuit. Level-shift circuits 72 ar added only to those inputs among the inputs and outputs of the NOR gates 70 which are directly associated with the external connection terminals 62, 64, 66 and 68. For example, since the first input of the NOR gate 70b and the second input of the NOR gate 70c are commonly connected to the flip-flop input 62, the level-shift circuit 72a is provided for the input 62. Since the remaining inputs of the NOR gates 70b and 70c are not connected to the external connection terminals but associated with the other internal NOR gates 70 of the DFF circuit 60, no level-shift circuits are provided for them. Level-shift circuits 72b, 72c and 72d are provided only for those inputs of the NOR gates 70d, 70e and 70f which are directly associated with the external connection terminals 64, 66 and 68 in the same arrangement. With such an arrangement, the aforementioned effect can be enhanced to the maximum by using the smallest number of level-shift circuits 72.

The concept of the "partial level-shift type" logic circuit structure of this invention may significantly vary in its way of application depending on how the circuit level of the semi-custom logic LSI having the multi-level circuit structure which is dealt with as a "unit circuit" is determined. For example, in the embodiment of FIGS. 1 and 2, the standard cell 14 is dealt with as the "unit circuit". In this case, since the circuit (such as the other standard cells 14b, 14c, . . . ) lying outside the circuit structure of this circuit level may be regarded as being an "external circuit", the input and output terminals of one standard cell 14a are dealt with as the "external connection terminals". Therefore, wirings for connecting the logic gates 26 of the standard cell 14a to one another are "internal wirings" and the level-shift circuits 38 are not provided for the above wirings. However, the concept of the "partial level-shift type" logic circuit structure of this invention works well even when the circuit level used is changed. An embodiment presented below is obtained by applying the concept of the "partial level-shift type" logic circuit structure of this invention to the semi-custom logic LSI 10 in which the function block 16 is used as the "unit circuit".

Assume that a function block 16i which is one of the plurality of function blocks 16 of the semi-custom logic LSI 10 of FIG. 1 is shown in FIG. 7. The function block 16i is a memory unit. For example, the function block 16i includes flip-flop circuits 80 each of which is constituted by cross-coupling two DCFL circuits shown in FIG. 3A, and n input buffers 82a, 82b, . . . , and 82n and n output buffers 84a, 84b, ..., and 84n which act as transfer buffers for the flip-flop circuit. According to this embodiment, since the function block 16i is used as the unit circuit, wirings (including signal transmission lines, power source voltage line, ground line, etc.) for interconnecting circuit constituting elements 80, 82 and 84 in the circuit structure of this circuit level to one another are all "internal wirings"; therefore, no level-shift circuits are provided for the wirings. Level-shift circuits 86a, 86b, . . . , and 86n are provided only for the inputs of the input buffers 82a, 82b, . . . , and 82n which are directly associated with external connection terminals 88a, 88b, . . . , and 88n. The basic concept for such an arrangement is exactly the same as that in the former embodiments. The loads may be resistance elements.

With such an arrangement, the operation reliability can be improved while the circuit construction of the function blocks 16 of the semi-custom logic LSI 10 is adequately simplified and the logic operation speed is kept sufficiently high. Particularly, in the case of the memory block 16i, since the lengths of the word lines and bit lines thereof can be minimized, data accessing time can be reduced and the minimum data write-in pulse width can be reduced while the operation margin is enlarged to the maximum.

Figure 8:
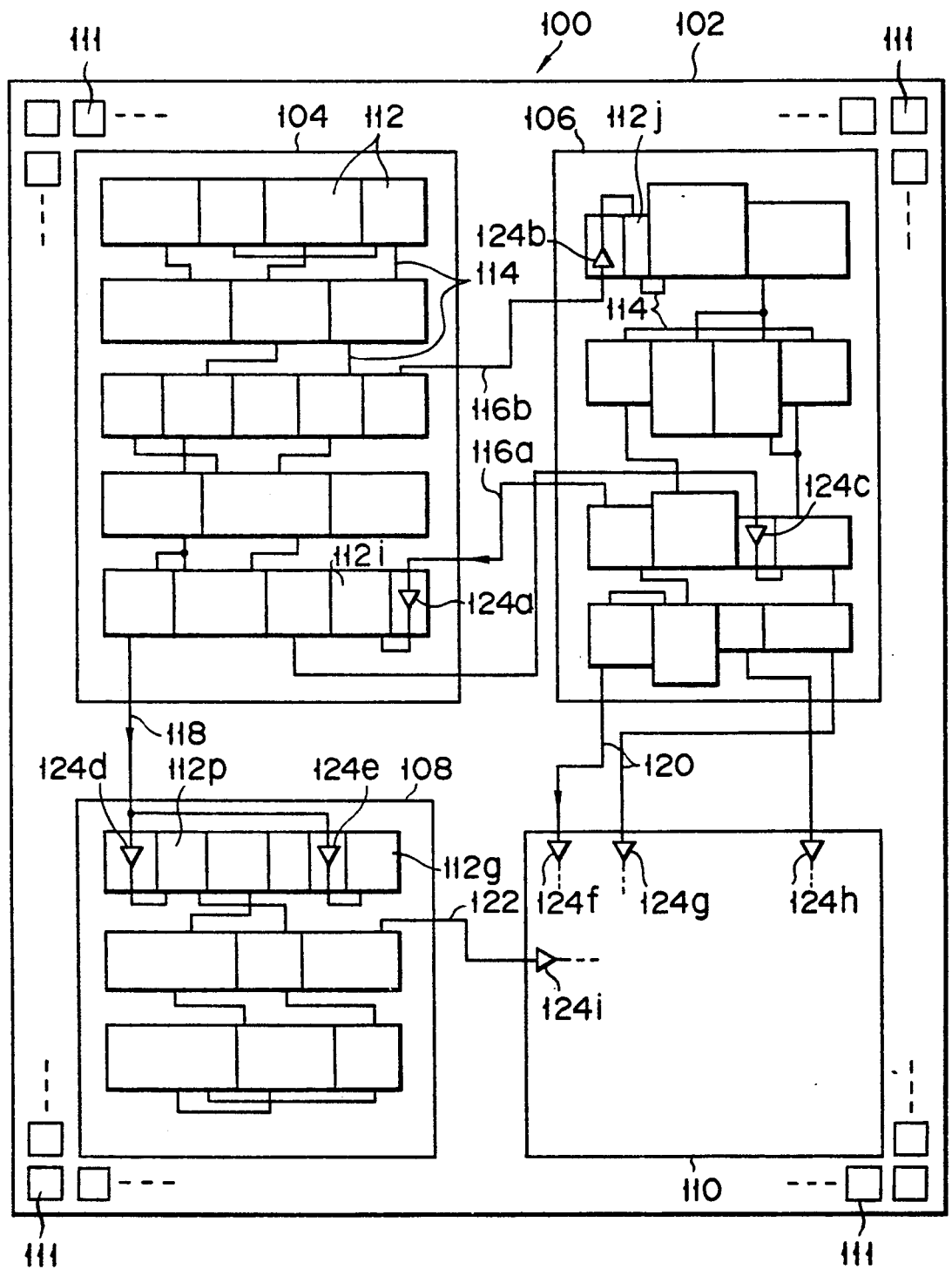
FIG. 8 is a diagram schematically showing the entire plan view of a standard-cell type semi-custom logic integrated circuit device according to still another embodiment of this invention.

An embodiment shown in FIG. 8 is obtained by further developing the aforementioned concept of the "partial level-shift type" logic circuit structure of this invention and using each of "function modules" of a semi-custom logic LSI 100 as the "unit circuit". Each of the function modules is constituted by a plurality of function blocks. As shown in FIG. 8, the semicustom logic LSI 100 includes a chip substrate 102. For example, four function modules 104, 106, 108 and 110 are disposed on the substrate 102. Pad patterns 111 are formed in the peripheral region of substrate 102; some of these patterns are applied with the ground potential. The function modules 104, 106 and 108 are logic function modules having standard cell structures. The function module 110 is a custom-designed memory section. In the standard-cell type function modules 104, 106 and 108, all of the standard cells 112 have a complete direct-coupled FET logic (DCFL) circuit structure and each of them is constituted by combining some of the circuit structures shown in FIGS. 3 and 4.

In each of the function modules 104, 106 and 108, interconnection wirings 114 connected between the standard cells 112 are all "internal wirings" like the power supply lines such as a power source voltage supply line and a ground line; therefore, no level-shift circuits are provided for the above wirings based on the aforementioned principle. As a result, in each of the modules, the logic swing width is simply kept at 0.6 volts and the logic operation speed can be enhanced to a maximum limit.

When viewed from each of the modules, signal transmission lines 116, 118, 120 and 122 connected between the function modules 104, 106 and 108 are "external connection wirings" or wirings which are directly associated with external connection terminals; therefore, level-shift circuits 124 are additionally provided for the wirings. This is explained in more detail. Referring to FIG. 8, in the function module 104, a standard cell 124a functioning as a level-shift circuit is provided in the preceding stage of the standard cell 112i which is directly associated with a wiring 116a for receiving a signal from the adjacent function module 106. No level-shifting standard cells are provided for output signal lines 116b and 118 of the function module 104 which are respectively associated with the function modules 106 and 108. This is because level-shifting standard circuits 124b, 124c, 124d and 124e are provided in the signal input stages of the destination function modules 106 and 108. Likewise, level-shift circuits 124f, 124g, 124h and 124i are additionally provided for those input terminals of the custom memory section 110 which receive output signals of the function modules 106 and 108.

It should be noted that, in each of the function modules 106 and 108, the level-shifting standard cells 124 are arranged so as to be positioned directly adjacent to a standard cell which is directly associated with the other function modules. For example, in the function module 104, the level-shifting standard cell 124a is arranged so as to be made in contact with the function module 106. Likewise, in the function module 106, a level-shifting standard cell 124b is arranged directly adjacent to a standard cell 112j which receives an output signal of the adjacent function module 106. Further, in the function module 108, level-shifting standard cells 124d and 124e are respectively arranged directly adjacent to standard cells 112p and 112q which receive an output signal of the function module 104. With such an arrangement, the capacitance of a naturally prevailing capacitor (stray capacitor) acting as a load for the output terminal of each of the level-shift circuits 124 is supposed to a minimum so as to minimize the signal transmission delay due to the presence of the level-shift stage. The number of level-shifting standard cells can be suppressed to a minimum by using each of the function module as the "unit circuit"; therefore, the operation speed and reliability can be further enhanced while the device integration density is kept at a desired degree.

The "level-shift stage adjoining arrangement" feature is particularly useful in a case where each of the level-shift circuits 124 is formed with such a diode type level-shift circuit structure as shown in FIGS. 4A to 4D. This is because the signal transmission delay in this type of level-shift circuit structure can be completely neglected if the output load capacitance thereof is sufficiently smaller than the junction capacitance of the diode (total capacitance in a case of series circuit of a plurality of diodes). As a result, the time delay in the level-shift stage of each function module can be further reduced by connecting capacitors (which are called "MIM" capacitors) constituted by metal-insulator-metal in parallel with the input and output terminals of the diode type level-shift circuit. It is considered possible to previously register the "MIM" capacitor as one of the "standard cells" into the designing library; in this case, it may be possible to commonly use an MIM standard cell for the level-shift circuits 124d and 124e of the function module 108.

The aforementioned concept of the "partial level-shift type" logic circuit structure of this invention can be applied to a semi-custom logic LSI in which power supply lines for supplying a third voltage Vss of negative potential in addition to power source voltage Vdd and ground voltage Vgnd are used without changing the original configuration thereof. Particularly, since much stress is put on the high operation speed in GaAs logic integrated circuit devices, there occurs a tendency to avoid laying the power supply lines in the standard logic cell area on the chip substrate; therefore, the power supply lines are generally laid in an exclusive-use wiring area which is defined separately from the standard cell area on the chip substrate. With this arrangement, three types of wiring areas must be separately provided on the chip substrate and therefore the substrate size is unwantedly increased. On the other hand, if the substrate area is previously determined, the effective logic element area must be reduced. However, the concept of the "partial level-shift type" logic circuit structure of this invention has an ability of completely solving the above problem.

Figure 9:
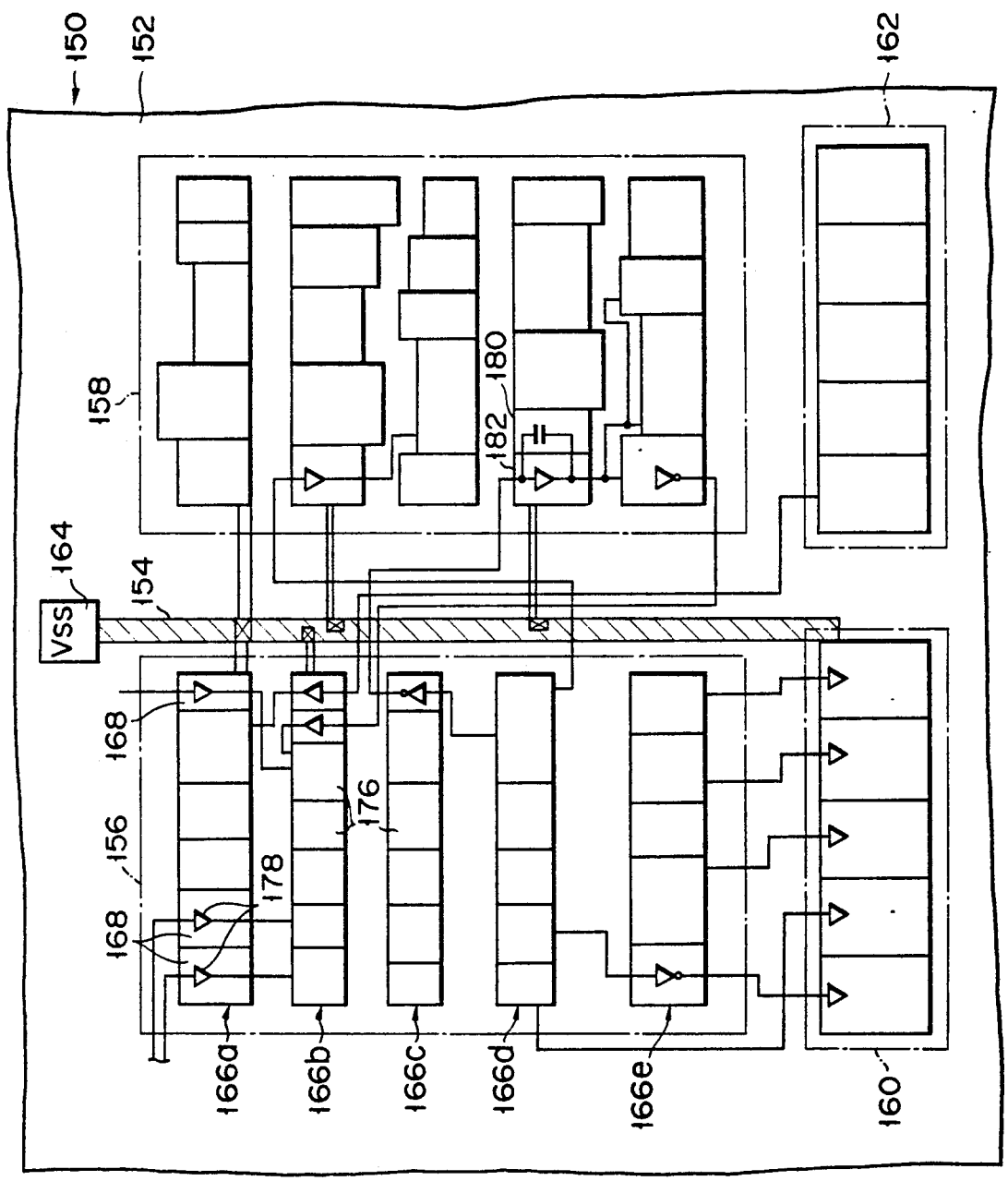
FIG. 9 is a diagram schematically showing the plan view of the main portion of a standard-cell type semi-custom logic integrated circuit device according to another embodiment of this invention.

In FIG. 9, a standard-cell type semi-custom gallium arsenide (GaAs) logic integrated circuit device is generally designated by a reference numeral "150". The device 150 includes a wiring 154 for supplying a negative power source voltage Vss on the chip substrate 52. In FIG. 9, two function modules 154 and 156 and two output interface portions 158 and 160 are visible. The negative power source supplying wiring 154 is formed to run between the function modules 154 and 156 and terminates at an external connection pad 164.

The function module 156 includes a selected number of, for example, five function blocks 166a to 166e (the term "function blocks" is equivalent to the term "standard-cell column"). The most significant function block 166a and the remaining function blocks 166b to 166e except the least significant function block 166e are standard-cell columns having the same DCFL circuit structure as in the former embodiments. Each of the most significant function block 166a and least significant function block 166e is special in that it is a block of standard cells in which various power supply lines are concentrated.

Figure 10:
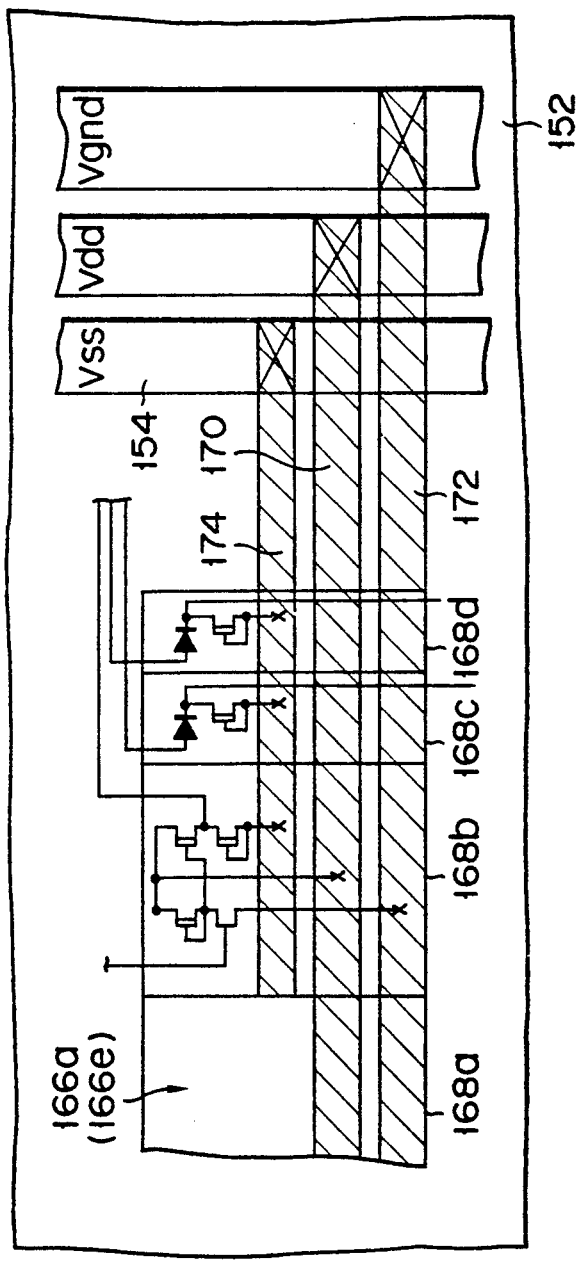
FIG. 10 is a diagram showing the plan view of a enlarged portion of the device of FIG. 9.

As shown in FIG. 10, function block 166a or function block 166e is an array of standard cells 168b, 168c and 168d which present a supply wire component 170 of positive power source Vdd, wiring component 172 of ground voltage Vgnd and supply wire component 174 of negative power source Vss unlike the left-side standard cell 168a. The remaining function blocks 166b to 166d are essentially constituted by DCFL type standard cells 176 using only the positive power source voltage Vdd and ground potential Vgnd in the same manner as in the above embodiments. (This is not means that negative power source voltage Vss is prevented from being completely used in these blocks; in some cases, voltage Vss may be actually used if required.) More specifically, if the ground potential is regarded as being a power source voltage, the standard cell 168a functions as a DCFL circuit operated on the ordinary two power source voltages Vdd and Vgnd. The standard cell 168b has FET circuits having source follower type buffer stages operated on three power source voltages Vdd, Vss and Vgnd. The output of the logic gate is connected to another function module. The standard cells 168c and 168d are connected to receive a signal from another function module and therefore they are dealt with as level-shift circuit cells. The Vdd and Vgnd supplying lines 170 and 172 extend through all of the cells 168a to 168d. The Vss supplying line 174 extends through only the cells 168b to 168d.

Level-shift standard cells 178 are provided for those of the standard cells 176 in the function module 156 which transfer signals with respect to the exterior, that is, those standard cells which transfer signals with respect to the other function modules according to the aforementioned concept of the "partial level-shift type" logic circuit structure of this invention. When required, the level-shifting standard cell and/or the aforementioned DCFL cell with a source follower type buffer stage including the power supply lines for voltages Vdd, Vss and Vgnd may be arranged.

The rule for the arrangement of the internal standard cells of each of the function modules 156 and 158 can be summarized as follows:

(1) Level-shifting standard cells acting as voltage interfaces of the function module 156 are preferentially or forcedly arranged on both sides of each of the most significant and least significant function blocks 166a and 166e, and if necessary, on both sides of the remaining blocks 166b, 166c and 166d.

(2) If it is not sufficient yet, level-shifting standard cells are sequentially laid out from both ends of each of the remaining blocks 166b, 166c and 166d towards the center thereof.

(3) Also, in a case where source follower type buffers are provided for logic gates serving as output interfaces of the function module 156, the buffers are forcedly arranged in preference to the other arranging condition in the logic design according to the above rules (1) and (2).

According to this embodiment, an occupied area necessary for layout of the power supply lines 154 and 174 of third power source voltage Vss can be minimized by concentrating the level-shift circuits 178 acting as the input interfaces of each function module and the DCFL cells with source follower type buffers acting as the output interfaces of each function module in the peripheral area of the standard cell array of each function module according to the above layout rules (1), (2) and (3).

Special attention should be paid to the following fact: increase in the length of the output wirings of the level-shift circuits in the above array can be easily and completely compensated for by applying the diode type circuit structure having MIM capacitors connected in parallel with the level-shift circuits or the source follower type DCFL circuit structure having a high driving ability. In the embodiment of FIG. 9, the former circuit structure is used. Now, take a good look at the function module 158 shown in FIG. 9. As is clearly shown in FIG. 9, an MIM capacitance cell 180 is provided directly adjacent to a level-shifting standard cell 182. It is not necessary to connect the MIM capacitance cell 180 to the exterior of the cell row but it is internally connected. The MIM capacitance cell 180 may enhance the operation speed of the level-shifting standard cell 182 so that the signal delay due to increase in the length of the output signal line of the level-shifting standard cell 182 can be substantially completely compensated for.

When the level-shifting standard cell arranging technique used in the embodiment of FIG. 9 was applied to the actual standard cell type semi-custom gallium arsenide (GaAs) logic integrated circuit device using the three power sources, the good result for maximizing the integration density described below was demonstrated. The inventors of this application simply set up a standard cell type semi-custom gallium arsenide (GaAs) logic integrated circuit device of 10 kilo-gates scale having no level-shift circuit without using the negative power source Vss according to the conventional arranging concept; as a result, the chip size was 49 square millimeters. In contrast, when a standard cell type semi-custom gallium arsenide (GaAs) logic integrated circuit device of substantially the same scale having partially added level-shift circuits and using the negative power source Vss was made on an experimental basis according to the concept of the "partial level-shift type" logic circuit structure of this invention, the chip size was 54 square milimeters. The result showed that increase in the chip size could be suppressed within approx. 10 percent. It was proved that the margin for the potential variation on the power supply lines could be improved by two or more times that of the conventional device and an excellent operation stability could be attained with only such a small increase in the chip size.

Another experimental result is presented below. A standard cell type semi-custom gallium arsenide (GaAs) logic integrated circuit device of 3 kilo-gates scale having level-shift circuits provided for all of the logic gates was simply set up according to the conventional arranging concept in order to improve the operation reliability as the main purpose; in this case, the chip size was 49 square millimeters. The circuit structure of FIG. 4A was used as the level-shift circuits. When the concept of the "partial level-shift type" logic circuit structure of this invention was applied to the same device, the chip size could be made as small as 25 square millimeters while reduction in the operation reliability was suppressed to a small degree which could be substantially neglected in a practical application. This showed that the chip size could be reduced approximately one-half. In other words, the integration density could be improved by substantially twice.

This result will be a great boon for the semiconductor manufacturers. This is because the gallium arsenide device has a drawback that the manufacturing yield thereof is originally low in comparison with that of a silicon device which is most popular among the presently available devices. According to the standard cell type semi-custom gallium arsenide (GaAs) logic integrated circuit device of 3 kilo-gates scale having a large chip size of 49 square millimeters set up by the above-described conventional method, the manufacturing yield will be 10 percent at most even if the manufacturing technique is improved with the best effort. With the device according to this invention, if the chip size is reduced to one-half, then the manufacturing yield of the gallium arsenide device in the same manufacturing condition can be directly enhanced to 30 percent. The improvement of the manufacturing yield will significantly contribute to enhancement of the productivity.

Further, according to the present invention, the GaAs-logic LSI can be improved in the operating reliability without degrading the integration density thereof, for the following reasons. In the conventional GaAs-LSIs, since MESFETs are used which consume more power than MOSFETs consume, those of MESFETs which are positioned in the central region of substrate and thus most far from some peripheral pads 111 for externally receiving the ground potential Vgnd tend to be varied in the ground potential: the ground potential therefor will be increased naturally. As a result, the low-level voltage generated by the logic circuit containing such MOSFETs is increased, which will cause logical malfunction. In that case, normal logical operations will be no longer expected. On the other hand, according to the GaAs-logic LSI of the present invention, the above ground potential variation can be successfully compensated for by selectively providing level-shift circuits with respect to the central logic circuits on the chip substrate. The selectively addition of level-shift circuits results in the overall circuit configuration being simplified, which can contribute to shorten the total length of ground potential wiring lines among function blocks on the chip substrate, whereby variation in ground potential on the wiring lines itself can be eliminated. With these features, the operating reliability of GaAs-logic LSI can be greatly improved.

What is claimed is:

1. A semiconductor integrated circuit device comprising:
   (a) a semiconductor substrate;
   (b) a plurality of unit circuits on said substrate having signal inputs and outputs, each of said unit circuits being formed of a plurality of direct-coupled transistor logic circuits which perform logic functions and have connection nodes directly associated with the remaining unit circuits and which internally deal with logic signals having a first preset logic swing width;
   (c) wiring means for connecting said unit circuits to one another so as to attain a desired logic function; and
   (d) level-shift circuit means for defining a second logic swing width greater than the first logic swing width as an external logic swing width of said unit circuits, said level-shift circuit means being arranged at a selected node or nodes among the connection nodes of said unit circuits, each of said selected nodes serving as a signal input; which is connected directly to the output of a corresponding unit circuit associated therewith, said level-shift circuit means not being connected to connection nodes which are interconnected to the direct-coupled transistor logic circuits inside said unit circuits.

2. The device according to claim 1, wherein said unit circuits include standard cells having logic gates.

3. The device according to claim 1, wherein said unit circuits are medium level circuit sections which are arranged on said substrate and each constructed by connecting standard cells to one another according to a preset routing.

4. The device according to claim 3, wherein said medium level circuit sections have signal inputs and signal outputs, and wherein said level-shift circuit means is provided only for an input or inputs of said standard cell or cells of each medium level circuit section which function as an input or inputs connected to an another of said medium level circuit sections which is directly associated with the corresponding medium level circuit section.

5. A standard cell type logic integrated circuit device comprising:
   (a) a semiconductive substrate;
   (b) function circuit sections on said substrate and connected to one another, some of said function circuit sections including a plurality of arrays of standard cells, each of said standard-cells essentially consisting of one or a plurality of direct-coupled gallium arsenide transistor logic gate circuits, and each of said logic gate circuits including one or more inputs and one output; and
   (c) level-shift circuit means additionally provided to said function circuit sections, for enhancing the original logic swing width of said logic gate circuits, said level-shift circuit means being arranged only at selected inputs of the standard cells in each of said function circuit sections, each of said selected inputs being directly connected to an output of an another of said function circuit sections which is directly associated with the corresponding function circuit section having said selected inputs and wherein said level shift circuit means not being connected to connection nodes which are interconnected to the direct-coupled transistor logic circuits inside said unit circuit.

6. The device according to claim 5, wherein said level-shift circuit means is provided for selected inputs of said logic gate circuits included in each of said plurality of arrays of standard cells, each of said selected inputs in each of said standard cell arrays being directly connected to the other standard cell array of another of said function circuit sections which is directly associated with the corresponding standard cell array having said selected inputs.

7. The device according to claim 5, wherein said level-shift circuit means is provided for selected inputs of logic gate circuits included in each of said standard cells, each of said selected inputs in each of said standard cells being directly connected to the other standard cell which is directly associated with the corresponding standard cell having said selected inputs.

8. The device according to claim 5, wherein said level-shift circuit means includes additional standard cells arranged on the peripheral portions of said function circuit sections.

9. The device according to claim 5, wherein said level-shift circuit means has a diode type level-shift circuit structure including one or more Schottky diodes.

10. The device according to claim 6, wherein said level-shift circuit means has a diode type level-shift circuit structure including one or more Schottky diodes.

11. The device according to claim 7, wherein said level-shift circuit means has a diode type level-shift circuit structure including one or more Schottky diodes.

12. The device according to claim 5, wherein said level-shift circuit means has a source follower type level-shift circuit structure including electric field effect transistors.

13. The device according to claim 6, wherein said level-shift circuit means has a source follower type level-shift circuit structure including electric field effect transistors.

14. The device according to claim 7, wherein said level-shift circuit means has a source follower type level-shift circuit structure including electric field effect transistors.

15. The device according to claim 8, further comprising:
   (d) a capacitance standard cell including a capacitive element arranged adjacent to at least one of said additional standard cells.

16. The device according to claim 15 wherein said capacitive element includes a metal-insulator-metal capacitor.

17. A semiconductor integrated circuit device comprising:
   a semiconductive substrate;
   unit circuits on said substrate having signal inputs and outputs, each of said unit circuits including direct-coupled transistor logic circuits which perform logic functions and have connection nodes directly associated with the remaining unit circuits and deal with logic signals having a first preset logic swing width, said unit circuits including standard cells having logic gates;
   wiring means for connecting said unit circuits to one another so as to attain a desired logic function; and
   level-shift circuit means for defining a second logic swing width greater than the first logic swing width, said level-shift circuit means being arranged at a selected node or nodes among the connection nodes of said unit circuit, each of said selected nodes serving as a signal input which is connected directly to the output of a corresponding unit circuit associated wherewith;
   said logic gates including a flip-flop circuit having output logic gates, and wherein said level-shift circuit means is also added to said output logic gates.

18. The device according to claim 17, wherein aid level-shift circuit means is arranged only at the signal inputs of said logic gates.

19. A standard-cell type semiconductor logic integrated circuit device comprising:
   a semiconductive substrate;
   a plurality of direct-coupled transistor logic circuit units on said substrate having signal inputs and outputs, each of said transistor logic circuit units having a plurality of transistors coupled together at interconnection nodes to perform a predetermined logic function with a first internal logic swing width being defined therein;
   wiring means arranged on said substrate, for electrically connecting said direct-coupled transistor logic circuit units to one another so as to accomplish a desired logic function of said device, said wiring means including a plurality of logic signal transmission lines;
   logic width expansion means additionally arranged at selected ones of the interconnection nodes of each of said direct-coupled transistor logic circuit units which nodes are directly connected to outputs of an another of said direct-coupled transistor logic circuit unit associated therewith, for providing a second logic swing width greater than the first logic swing width on a logic signal transmission line or lines between said each of said direct-coupled transistor logic circuit units and said another of said direct-coupled transistor logic circuit units; and
   said logic width expansion means comprising a level-shift circuit for enhancing a logical amplitude at the selected interconnection nodes of said each of said direct-coupled transistor logic circuit units, said level-shift circuit including a semiconductor and wherein said level shift circuit is not connected to the connection nodes which are interconnected to the direct-coupled transistor logic circuits inside said unit circuit.

20. The device according to claim 19, wherein said plurality of transistors comprise metal insulator semiconductor field effect transistors.

21. The device according to claim 20, wherein said semiconductor diode includes a Schottky diode.

22. The device according to claim 21, wherein said plurality of direct-coupled transistor logic circuit units comprise standard-cells each of which includes a plurality of logic gates.

23. The device according to claim 21, wherein said plurality of direct-coupled transistor logic circuit units comprise circuit modules each of which includes standard-cells each of which includes a plurality of logic gates.

24. A standard-cell type semiconductor logic integrated circuit device comprising:
   a semiconductor substrate;
   a plurality of direct-coupled transistor logic circuit units on said substrate having signal inputs and outputs, each of said transistor logic circuit units having a plurality of metal insulator semiconductor field effect transistors coupled together at interconnection nodes to perform a predetermined logic function with a first internal logic swing being defined therein;
   wiring means arranged on said substrate, for electrically connecting said direct-coupled transistor logic circuit units to one another so as to accomplish a desired logic function of said device, said wiring means including a plurality of logic signal transmission lines;
   logic width expansion means additionally arranged at selected one of the interconnection nodes of each of said direct-coupled transistor logic circuit units said nodes being directly connected to the outputs of another of said direct-coupled transistor logic circuit units associated therewith, for providing a second logic swing width greater than that of said first logic swing width on a logic signal transmission line or lines between each of said direct-coupled transistor logic circuit units and said another of said direct couple transistor logic circuit units;

said logic with expansion means comprising a level shift circuit for enhancing a logical amplitude at the selected interconnection nodes of each of said direct-coupled transistor logic circuit units, said level shift circuit including a semiconductor diode comprised of a Schottky diode; and wherein said level shift circuit means not being connected to connection nodes which are interconnected to the direct-coupled transistor logic circuits inside said unit circuit, wherein said plurality of direct-coupled transistor logic circuit units includes a direct-coupled transistor logic circuit unit having a plurality of logic gates including output logic gates constituting a flip-flop circuit, each of said output logic gates having a signal-feedback input at which said logic width expansion means is also added.

* * * * *